(12) United States Patent
Chuang et al.

(10) Patent No.: US 6,677,223 B2
(45) Date of Patent: Jan. 13, 2004

(54) TRANSISTOR WITH HIGHLY UNIFORM THRESHOLD VOLTAGE

(75) Inventors: Chiao-Shun Chuang, Hsinchu (TW); Chien-Ping Chang, Hsinchu (TW); Mao-Song Tseng, Hsinchu (TW); Hsin-Huang Hsieh, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/219,092

(22) Filed: Aug. 13, 2002

(65) Prior Publication Data
US 2003/0060033 A1 Mar. 27, 2003

(30) Foreign Application Priority Data
Sep. 21, 2001 (TW) ........................................ 90123295 A

(51) Int. Cl.[7] .......................... H01L 21/20; H01L 21/36; H01L 21/04; H01L 21/76
(52) U.S. Cl. ........................ 438/496; 438/443; 438/451
(58) Field of Search ................................. 438/166, 275, 438/298, 443, 451, 287, 496, 502

(56) References Cited
U.S. PATENT DOCUMENTS

| | | | |
|---|---|---|---|
| 4,851,364 A | * | 7/1989 | Yatsuda et al. ............. 438/275 |
| 5,003,375 A | * | 3/1991 | Ichikawa ..................... 438/592 |
| 5,090,982 A | * | 2/1992 | Bradshaw et al. ........ 369/275.4 |
| 6,448,118 B2 | * | 9/2002 | Yamazaki et al. ........... 438/166 |
| 6,559,518 B1 | * | 5/2003 | Niwa .......................... 438/496 |

* cited by examiner

Primary Examiner—John F. Niebling
Assistant Examiner—Walter L. Lindsay, Jr.
(74) Attorney, Agent, or Firm—Townsend and Townsend and Crew LLP

(57) ABSTRACT

Embodiments of the present invention relate to processes utilized in the manufacturing of a semiconductor device having transistors to achieve high uniformity of threshold voltages. The invention does so by ensuring high uniformity of impurity concentration in the substrate. In one embodiment, a method for manufacturing a semiconductor device having transistors with high uniformity of threshold voltages comprises providing a substrate and a source of impurities, and disposing the substrate and the source of impurities in a first oxygen gas at a first initial temperature and heated to a first target temperature at a first temperature rate to drive the impurities into the substrate. The first initial temperature is sufficiently low to prevent the oxygen from diffusing into the substrate. The substrate is disposed in a second oxygen gas at a second initial temperature and heated to a second target temperature at a second rate to form an oxide layer on the substrate. The second rate is high enough for rapid formation of the oxide layer on the substrate so as to prevent the impurities driven into the substrate from diffusing out from the substrate.

20 Claims, 1 Drawing Sheet

US 6,677,223 B2

TRANSISTOR WITH HIGHLY UNIFORM THRESHOLD VOLTAGE

CROSS-REFERENCES TO RELATED APPLICATIONS

This application claims priority from R.O.C. Patent Application No. 090123295, filed Sep. 21, 2001, the entire disclosure of which is incorporated herein by reference.

BACKGROUND OF THE INVENTION

The present invention relates to semiconductor manufacturing and, more particularly, to improving the uniformity of substrate impurity concentration, which may be used to form a transistor with a highly uniform threshold voltage.

Threshold voltages of transistors are seriously affected by the impurity concentration of the substrate on which the transistors are formed. A low uniformity of substrate impurity concentration causes a huge variation of the threshold voltages of the transistors formed on a single wafer.

The impurity concentration uniformity of the substrate deteriorates easily, for instance, during P-body driving in and formation of SAC (sacrificial) oxide layers. In the two processing steps, the wafer or substrate is disposed in an oxygen gas at a temperature of 900° C. and heated to 1100° C. at a rate of 5° C./min. The wafer is distorted due to the differences between expansion coefficients of layers on the wafer, whereby the lattice of the silicon substrate is enlarged in some areas on the wafer. This causes the oxygen to diffuse into the substrate and decreases the impurity concentration in those areas. Therefore, the impurity concentration of the substrate is non-uniform, which can result in a significant variation of the threshold voltages of the transistors subsequently formed on the substrate.

BRIEF SUMMARY OF THE INVENTION

Embodiments of the present invention relate to processes utilized in the manufacturing of a semiconductor device having transistors to achieve high uniformity of threshold voltages. The invention does so by ensuring high uniformity of impurity concentration in the substrate. During P-body driving in by heating the substrate and the source of impurities from a first initial temperature to a first target temperature in an oxygen gas, the initial temperature is set sufficiently low to prevent the oxygen from diffusing into the substrate and decrease the impurity concentration. During the formation of SAC oxide layer by heating the substrate from a second initial temperature to a second target temperature in an oxygen gas, the rate of increasing the temperature is set sufficiently high to achieve rapid formation of the oxide layer on the substrate so as to prevent the impurities driven into the substrate from diffusing out of the substrate.

In accordance with an aspect of the present invention, a method for manufacturing a semiconductor device having transistors with high uniformity of threshold voltages comprises providing a substrate and a source of impurities, and disposing the substrate and the source of impurities in a first oxygen gas at a first initial temperature and heated to a first target temperature at a first temperature rate to drive the impurities into the substrate. The first initial temperature is sufficiently low to prevent the oxygen from diffusing into the substrate. The substrate is disposed in a second oxygen gas at a second initial temperature and heated to a second target temperature at a second rate to form an oxide layer on the substrate. The second rate is high enough for rapid formation of the oxide layer on the substrate so as to prevent the impurities driven into the substrate from diffusing out from the substrate.

In some embodiments, the substrate is a silicon substrate. The first initial temperature ranges from about 750° C. to about 850° C. The first rate ranges from about 4° C./min to about 6° C./min. The first target temperature is about 1100° C. The second initial temperature ranges from about 850° C. to about 950° C. The second rate ranges from about 8° C./min to about 12° C./min. The method may further comprise forming a trench in the substrate wherein the oxide layer is formed along sidewalls of the trench. A conducting layer may be formed on the oxide layer, filling the trench.

In specific embodiments, the second target temperature is about 1100° C. A conducting layer may be formed on the oxide layer. The conducting layer is a polysilicon layer. The oxide layer is a sacrificial oxide layer.

In accordance with another aspect of the present invention, a method for manufacturing a semiconductor device comprises providing a substrate and a source of impurities, and disposing the substrate and the source of impurities in a first oxygen gas at a first initial temperature and heated to a first target temperature at a first temperature rate to drive the impurities into the substrate. The first initial temperature is sufficiently low to prevent the oxygen from diffusing into the substrate.

In some embodiments, the first initial temperature is substantially below 900° C. The first initial temperature typically ranges from about 750° C. to about 850° C.

In accordance with another aspect of the invention, a method of forming an oxide layer on a substrate containing impurities comprises disposing the substrate containing the impurities in a second oxygen gas at a second initial temperature and heated to a second target temperature at a second rate to form an oxide layer on the substrate. The second rate is high enough for rapid formation of the oxide layer on the substrate so as to prevent the impurities driven into the substrate from diffusing out from the substrate.

In some embodiments, the second initial temperature ranges from about 850° C. to about 950° C., and the second target temperature is about 1100° C. The second rate is substantially greater than 5° C./min. The second rate typically ranges from about 8° C./min to about 12° C./min.

DETAILED DESCRIPTION OF THE INVENTION

Figure 1A:
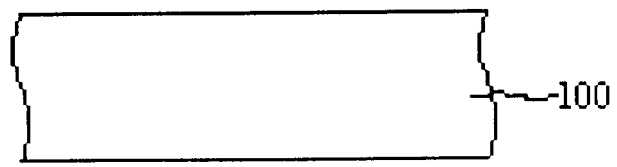
FIG. 1A is a schematic sectional view of a substrate.

As shown in FIG. 1A, a silicon substrate 100 is provided.

Figure 1B:
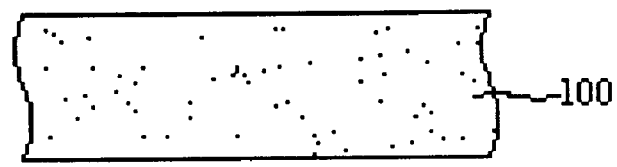
FIG. 1B is a schematic sectional view of the substrate of FIG. 1A with boron ions driven into the substrate according to an embodiment of the present invention.

As shown in FIG. 1B, a boron material as a source of the impurities is pre-disposed in the substrate 100, for instance, by diffusion or ion implantation. The substrate 100 and the boron material are then disposed in an oxygen gas at an initial temperature and heated to a target temperature. During this process, the boron ions are driven into the substrate 100. Unlike in the conventional method, the initial temperature is set sufficiently low such that the oxygen does not diffuse into the substrate 100 and cause nonuniformity in the impurity concentration in those regions. For example, the initial temperature is substantially below 900° C. for driving boron into a silicon substrate, typically ranging from about 750° C. to about 850° C. The silicon substrate 100 is heated from the initial temperature to a target temperature of about 1100° C. at a rate ranging from about 4° C./min to about 6° C./min. This is typically performed in a chamber with a gas flow controller to control the gas flow and a temperature controller to adjust the temperature. Thus, the boron ions are driven into the substrate 100, at least substantially without oxygen diffusion into the substrate to cause nonuniformity in the boron concentration in the substrate 100.

Figure 1C:
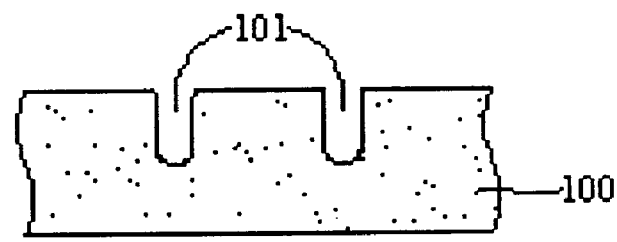
FIG. 1C is a schematic sectional view of the substrate of FIG. 1B with trenches formed therein.

As shown in FIG. 1C, the substrate 100 is etched and one or more trenches 101 are formed in the substrate 100. The etching may be performed in the same chamber or a different chamber which provides the suitable gas flow, temperature, pressure, and the like.

Figure 1D:
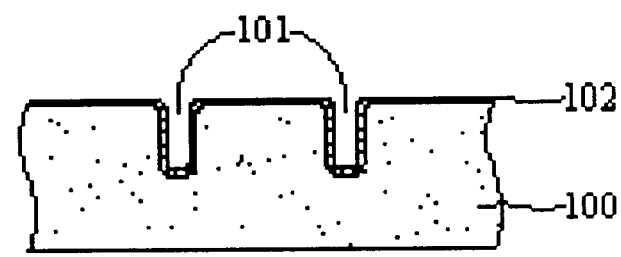
FIG. 1D is a schematic sectional view showing formation of a sacrificial oxide layer over the trenched substrate of FIG. 1C according to an embodiment of the present invention.

As shown in FIG. 1D, the substrate 100 is again disposed in an oxygen gas at an initial temperature and heated to a target temperature, to form a sacrificial oxide layer 102 on the sidewalls of the trenches 101 and the surface of the substrate 100. In this case, it is desirable to prevent the boron impurities in the substrate 100 from diffusing out of the substrate 100. To do so, the temperature rate from the initial temperature to the target temperature should be sufficiently high to cause a rapid formation of the sacrificial oxide layer 102, which serves to block diffusion of the boron impurities out from the substrate 100. For boron impurities in the silicon substrate 100, the initial temperature typically ranges from about 850° C. to about 950° C. The silicon substrate 100 is heated from the initial temperature to a target temperature of about 1100° C. at a rate ranging from about 8° C./min to about 12° C./min. Thus, the sacrificial oxide layer 102 is formed on the sidewalls of the trenches 101 and the surface of the substrate 100. The boron impurities are prevented from diffusing out from the substrate 100 by the sacrificial oxide layer 102, due to the rapid formation of the oxide layer 102 at the temperature rate that is substantially higher than that used in the conventional method. In this example, the temperature rate of about 8° C./min to about 12° C./min is twice the conventional temperature rate of about 4° C./min to about 6° C./min, and is substantially greater than 5° C./min.

Figure 1E:
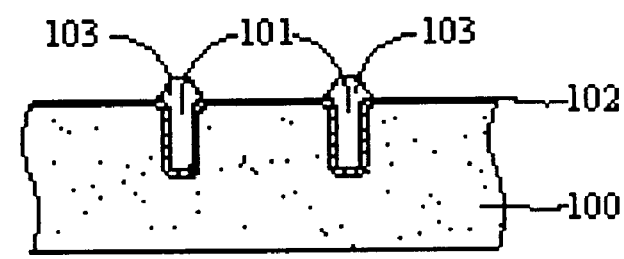
FIG. 1E is a schematic sectional view illustrating the filling of the trenches of the substrate of FIG. 1D according to an embodiment of the present invention.

As shown in FIG. 1E, a polysilicon layer 103 is formed on the oxide layer 102 filling the trench 101. The polysilicon layer 103 is used for a gate.

The processes as described above are typically performed in one or more process chambers which include systems for controlling gas flow through the chamber, temperature and pressure in the chamber, and the like. Various chambers which may be suitable for carrying out the processes of the present invention are known in the art.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A method for manufacturing a semiconductor device having transistors with high uniformity of threshold voltages, the method comprising:

providing a substrate and a source of impurities;

disposing the substrate and the source of impurities in a first oxygen gas at a first initial temperature and heated to a first target temperature at a first temperature rate to drive the impurities into the substrate, wherein the first initial temperature is sufficiently low to prevent the oxygen from diffusing into the substrate; and disposing the substrate in a second oxygen gas at a second initial temperature and heated to a second target temperature at a second rate to form an oxide layer on the substrate, wherein the second rate is high enough for rapid formation of the oxide layer on the substrate so as to prevent the impurities driven into the substrate from diffusing out from the substrate.

2. The method of claim 1 wherein the substrate is a silicon substrate.

3. The method of claim 1 wherein the first initial temperature ranges from about 750° C. to about 850° C.

4. The method of claim 1 wherein the first rate ranges from about 4° C./min to about 6° C./min.

5. The method of claim 1 wherein the first target temperature is about 1100° C.

6. The method of claim 1 wherein the second initial temperature ranges from about 850° C. to about 950° C.

7. The method of claim 1 wherein the second rate ranges from about 8° C./min to about 12° C./min.

8. The method of claim 7 further comprising forming a trench in the substrate wherein the oxide layer is formed along sidewalls of the trench.

9. The method of claim 8 further comprising forming a conducting layer on the oxide layer, the conducting layer filling the trench.

10. The method of claim 1 wherein the second target temperature is about 1100° C.

11. The method of claim 1 further comprising forming a conducting layer on the oxide layer.

12. The method of claim 11 wherein the conducting layer is a polysilicon layer.

13. The method of claim 11 wherein the oxide layer is a sacrificial oxide layer.

14. A method for manufacturing a semiconductor device, the method comprising:

providing a substrate and a source of impurities; and disposing the substrate and the source of impurities in a first oxygen gas at a first initial temperature and heated to a first target temperature at a first temperature rate to drive the impurities into the substrate, wherein the first initial temperature is sufficiently low to prevent the oxygen from diffusing into the substrate.

15. The method of claim 14 wherein the first initial temperature is substantially below 900° C.

16. The method of claim 15 wherein the first initial temperature ranges from about 750° C. to about 850° C.

17. A method of forming an oxide layer on a substrate containing impurities, the method comprising:

disposing the substrate containing the impurities in a second oxygen gas at a second initial temperature and heated to a second target temperature at a second rate to form an oxide layer on the substrate, wherein the second rate is high enough for rapid formation of the oxide layer on the substrate so as to prevent the impurities driven into the substrate from diffusing out from the substrate.

18. The method of claim 17 wherein the second initial temperature ranges from about 850° C. to about 950° C., and the second target temperature is about 1100° C.

19. The method of claim 17 wherein the second rate is substantially greater than 5° C./min.

20. The method of claim 19 wherein the second rate ranges from about 8° C./min to about 12° C./min.

* * * * *